United States Patent [19]
Nakamura et al.

[11] Patent Number: 5,490,796
[45] Date of Patent: Feb. 13, 1996

[54] IC SOCKET EQUIPPED WITH DUST DISCHARGE MEANS

[75] Inventors: Ryuichi Nakamura, Kawasaki; Kazunori Nakano, Tokyo, both of Japan

[73] Assignee: Yamaichi Electronics Co., Ltd., Tokyo, Japan

[21] Appl. No.: 324,666

[22] Filed: Oct. 18, 1994

[30] Foreign Application Priority Data

Oct. 18, 1993 [JP] Japan .................................. 5-284009

[51] Int. Cl.⁶ ................................................. H01R 11/22
[52] U.S. Cl. ........................................... 439/266; 439/330
[58] Field of Search ............................. 439/41, 190, 206, 439/207, 259, 263, 264, 266, 330, 331

[56] References Cited

U.S. PATENT DOCUMENTS 3,678,432  7/1972  Boliver .............................. 439/206 X
4,123,131  10/1978  Pearce, Jr. et al. .................. 439/206
5,009,609  4/1991  Matsuoka et al. .

*Primary Examiner*—Khiem Nguyen
*Attorney, Agent, or Firm*—Wenderoth, Lind & Ponack

[57] ABSTRACT

An IC socket equipped with a dust discharge device includes an IC socket body having a plurality of contacts electrically connected in a pressed condition to a plurality of leads of an IC package, and a dust discharge duct mounted on the IC socket body and adapted to allow for the discharge of dust produced or generated from the leads or body of the IC package. An upper end of the dust discharge duct opens adjacent the positions of the leads.

18 Claims, 5 Drawing Sheets

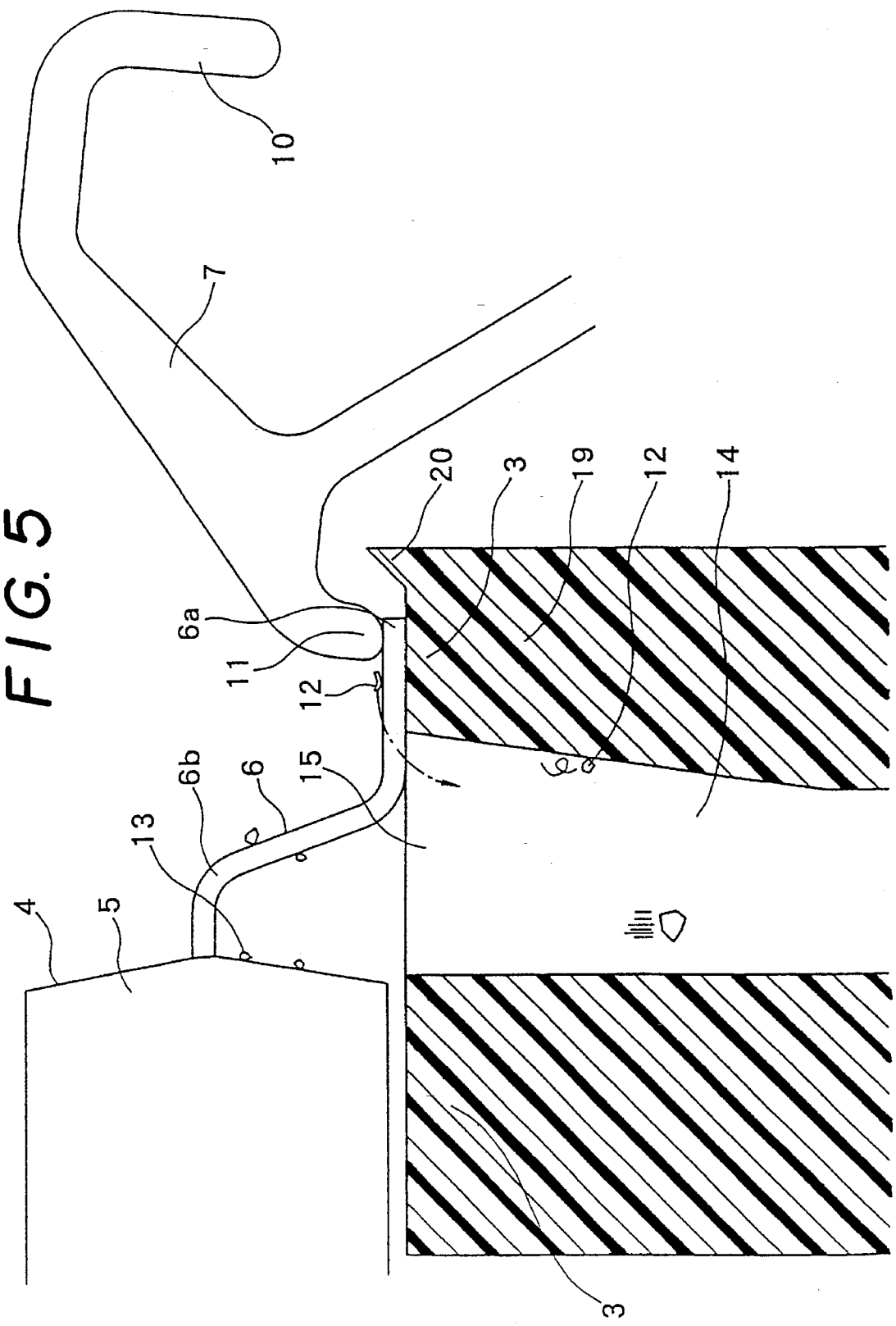

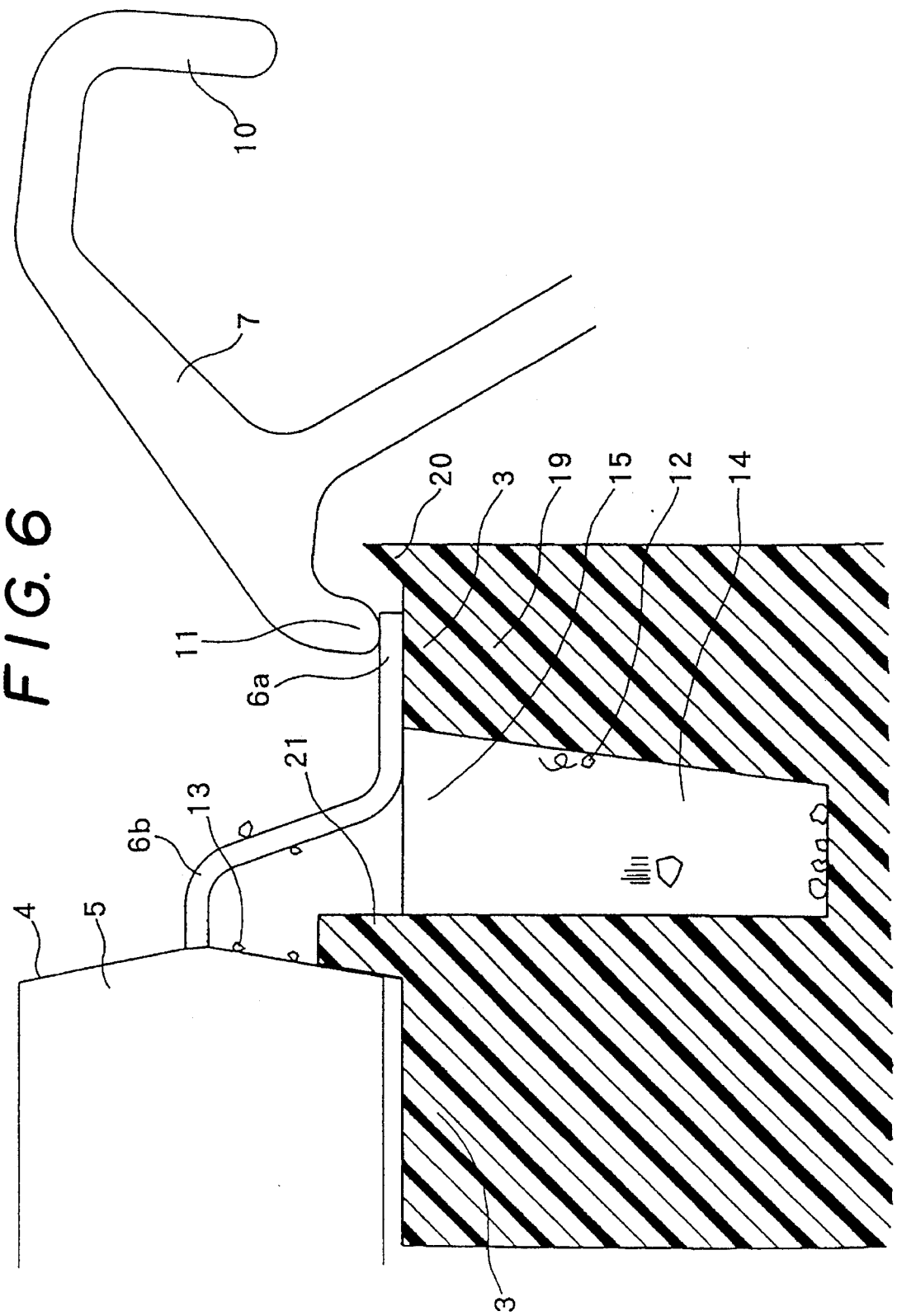

IC SOCKET EQUIPPED WITH DUST DISCHARGE MEANS

BACKGROUND OF THE INVENTION

1. Field of the Invention

This invention relates to an IC socket equipped with means for discharging dust produced or generated from IC leads or an IC body.

2. Brief Description of the Prior Art

An IC socket discussed, for example, in U.S. Pat. No. 5,009,609 comprises a pedestal provided on a bottom part of an IC receiving section and adapted to support leads of an IC package, contacts arranged, side by side, along two opposing sides of this pedestal, and a pressing cover provided on an upper part of a socket body and adapted to displace the contacts for achieving an electrical connection with the IC leads. In operation, this pressing cover is depressed to apply a depressing force to the contacts, the contacts are displaced into an open position against elasticity thereof, and when the depressing force of the pressing cover is removed, the contacts are restored back to a closing position, so that each contact is connected, in a pressing condition, to the surface of the IC lead supported by the pedestal.

In the above-mentioned conventional IC socket, when the contact is elastically connected to the surface of the IC lead under pressure, metal powder is produced by rubbing. This metal powder is accumulated on the surface of the pedestal and creates a cause for forming a short circuit between the IC leads. Dust and molding refuse produced during a resin molding process of the IC socket body are adhered to the surface of the IC lead. The dust and molding refuse are accumulated on the upper surface of the pedestal. Thus, there is a fear that the lead of the IC package will climb over and become deformed due to the dust, etc. The above problem has become more manifest in view of the recent tendency toward the IC leads be arranged with smaller pitches. Therefore, it is necessary for this problem to be resolved.

SUMMARY OF THE INVENTION

It is, therefore, a general object of the present invention to provide an IC socket equipped with a dust discharge means which is capable of properly resolving the above-mentioned problems inherent in the prior art.

As means for resolving the problems, according to the present invention, an IC socket body includes a dust discharge duct adapted to allow for discharge of various dust produced or generated from IC leads, and an upper end of this dust discharge duct is open to at a position adjacent the leads, so that the dust is dropped into the duct through the opening.

From another aspect of the present invention, an upper end of the dust discharge duct is open to each row of the contacts which are arranged in side by side relation, so that the dust is discharged through the openings.

The dust discharge duct may have a closed bottom, so that the dust is accumulated on this bottom and the accumulated dust is ejected through the upper opening, for example. Also, a lower end of the dust discharge duct may be open through a lower surface of the socket body, so that the dust is discharged through this lower opening.

According to the present invention thus constructed, metal powder produced when the contact is connected to the surface of the IC lead under pressure, or dust or molding refuse adhered to the IC lead or the IC package body can drop through the dust discharge duct so as to be ejected.

As a result, the problem in which the dust produced or generated from the IC lead is accumulated on the lead supporting portion, etc. to thereby degrade the electrical insulation between the leads and the problem of a short circuit formed between the IC leads due to the dust can be effectively resolved.

Also, by opening the dust discharge duct to each row of the contacts, there can be provided a socket in which metal powder produced or generated from the connecting portion between the array of contacts and leads, and dust and molding refuse adhered to the leads are collected into the common duct so as to be ejected. In the case where the dust discharge duct has a closed bottom, dust accumulated on the bottom may be left as it is or discharged through the upper opening using a vacuum device.

In the case where the lower end of the dust discharge duct is open to the lower surface of the socket, dust can be discharged through this lower opening using a vacuum device.

Other objects and features of the invention will become more apparent during the course of the following description when taken in connection with the accompanying drawings.

BRIEF DESCRIPTION OF THE DRAWING

FIG. 5 is an enlarged cross-sectional view of a connecting portion between an IC lead and a contact in the IC socket of FIG. 1; and FIG. 6 is an enlarged cross-sectional view of a connecting portion between an IC lead and a contact in an IC socket according to another embodiment of the present invention.

DETAILED DESCRIPTION OF THE EMBODIMENT

Figure 1:
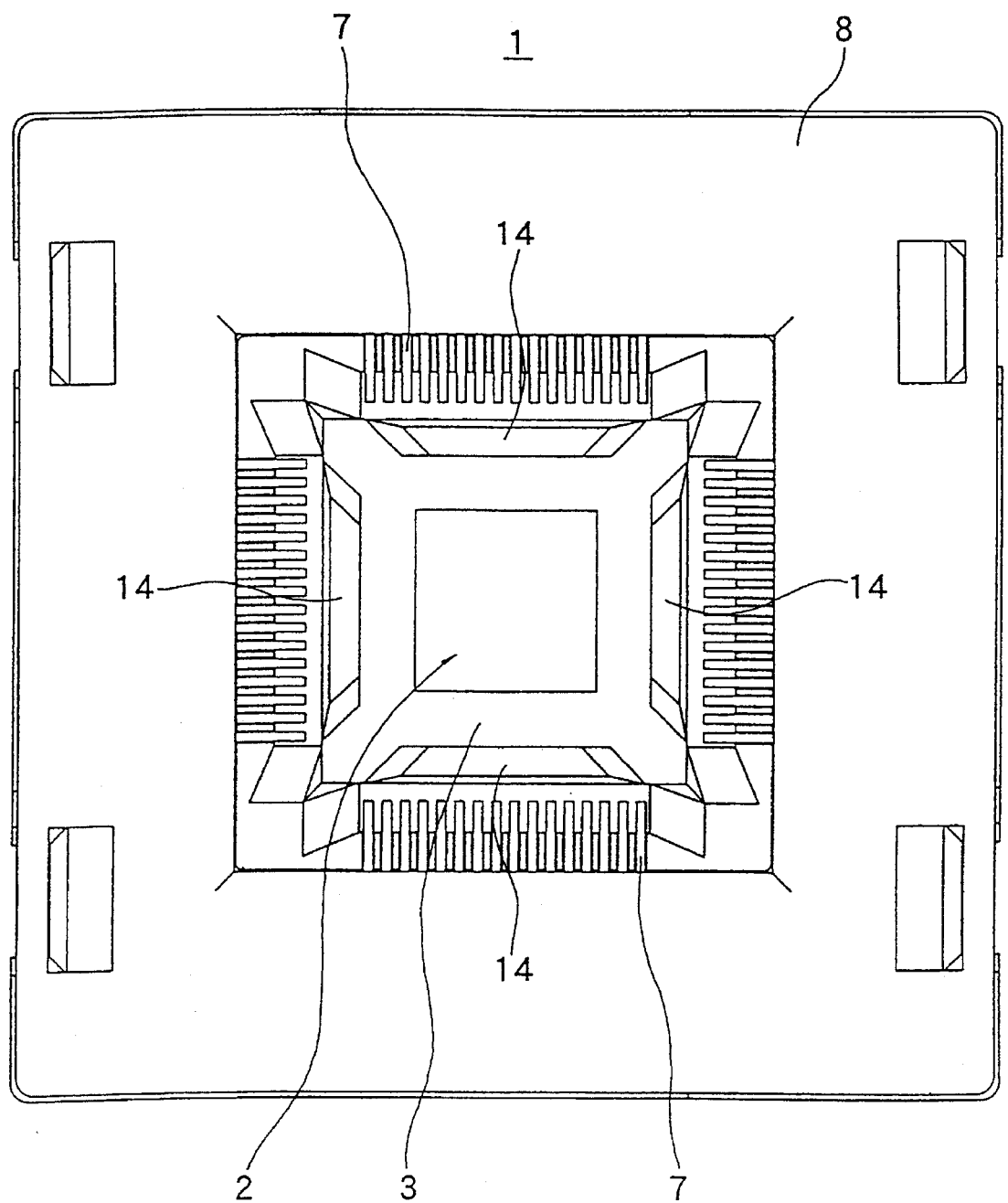
FIG. 1 is a plan view of an IC socket equipped with a dust discharge means according to one embodiment of the present invention.

The present invention will now be described in detail with reference to FIGS. 1 to 6 of the accompanying drawings.

A socket body 1 has an IC receiving section 2 opening to an upper central area thereof, and a pedestal 3 disposed at a bottom part of the IC receiving section 2. This pedestal 3 is adapted to support an IC package 4 received in the IC receiving section 2.

As one example, this IC package 4 has gull-wing leads 6 projecting from two opposing side faces of an IC package body 5.

The present invention is applicable to an IC package having the gull-wing leads, an IC package having J-bend leads (not shown), or an IC package having flat leads.

The pedestal 3 supports a lower surface of a distal end of each gull-wing lead 6, for example, such that the IC package body 5 is not in contact with the pedestal 3; in other words, the pedestal 3 supports the IC package body 5 in a floating state as best shown in FIG. 5.

The socket body 1 has contacts 7 which are arranged, side by side, along at least two opposing sides of the pedestal 3. Each contact 7 can be displaced between a position for connecting to the IC lead 6 and a position for removing the connection. As a displacement means, a pressing cover 8 movable upwardly and downwardly is provided at an upper part of the socket body 1. When the pressing cover 8 is, in operation, depressed, a lever 9 is pivoted in one direction, so that a hook 10 of the each contact 7 engaging the lever 9 is pulled rearwardly (outwardly) to elastically displace the contact 7 into the connection removing position against the elasticity thereof. In that state, the IC package 4 is inserted into and removed from the IC receiving section 2. When a force for depressing the pressing cover 8 is removed, the contact 7 is forwardly restored to thereby allow a connection nose 11 thereof to connect, in a pressed condition, to an upper surface of the IC lead 6 which is supported on an upper surface of the pedestal 3.

When the connection nose 11 of the contact 7 is connected, in a pressed condition, to the surface of the lead 6, metal powder 12 is produced by rubbing.

The metal powder 12 is accumulated on the upper surface of the pedestal 3 as the contact 7 is repeatedly connected, in a pressing condition, to the IC lead 6. This can be a cause for forming a short-circuit between the IC leads 6.

Also, dust and molding refuse 13 produced during the molding process of the IC package body 5 are, in many cases, adhered to the surface of the IC leads 6 and the side surfaces of the IC package body 5. There is a fear that the dust and molding refuse 13 will accumulate on the upper surface of the pedestal 3 and, as a result, the electrical insulation between the IC leads 6 will be degraded. This problem will become more serious as the arrangement pitches of the IC leads become smaller.

The pedestal 3 has a dust discharge duct 14 adapted to allow the dust 12 or 13 produced from the IC leads 6 to drop therethrough. An upper end of the dust discharge duct 14 is open at a lower position of the IC lead 6, so that the dust 12, 13 is allowed to drop through the discharge duct 14.

Figure 2:
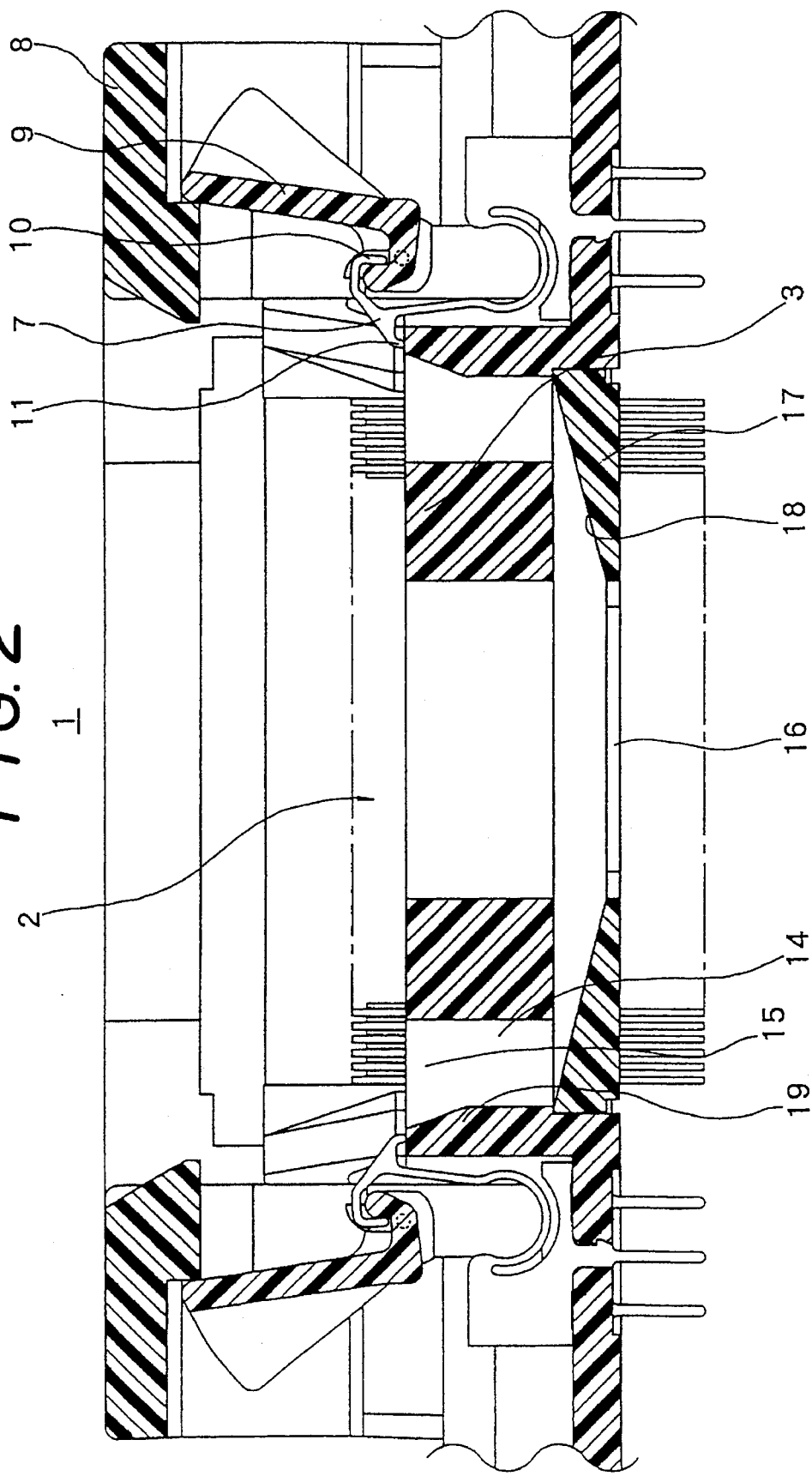
FIG. 2 is a cross-sectional view of the IC socket of FIG. 1.
Figure 3:
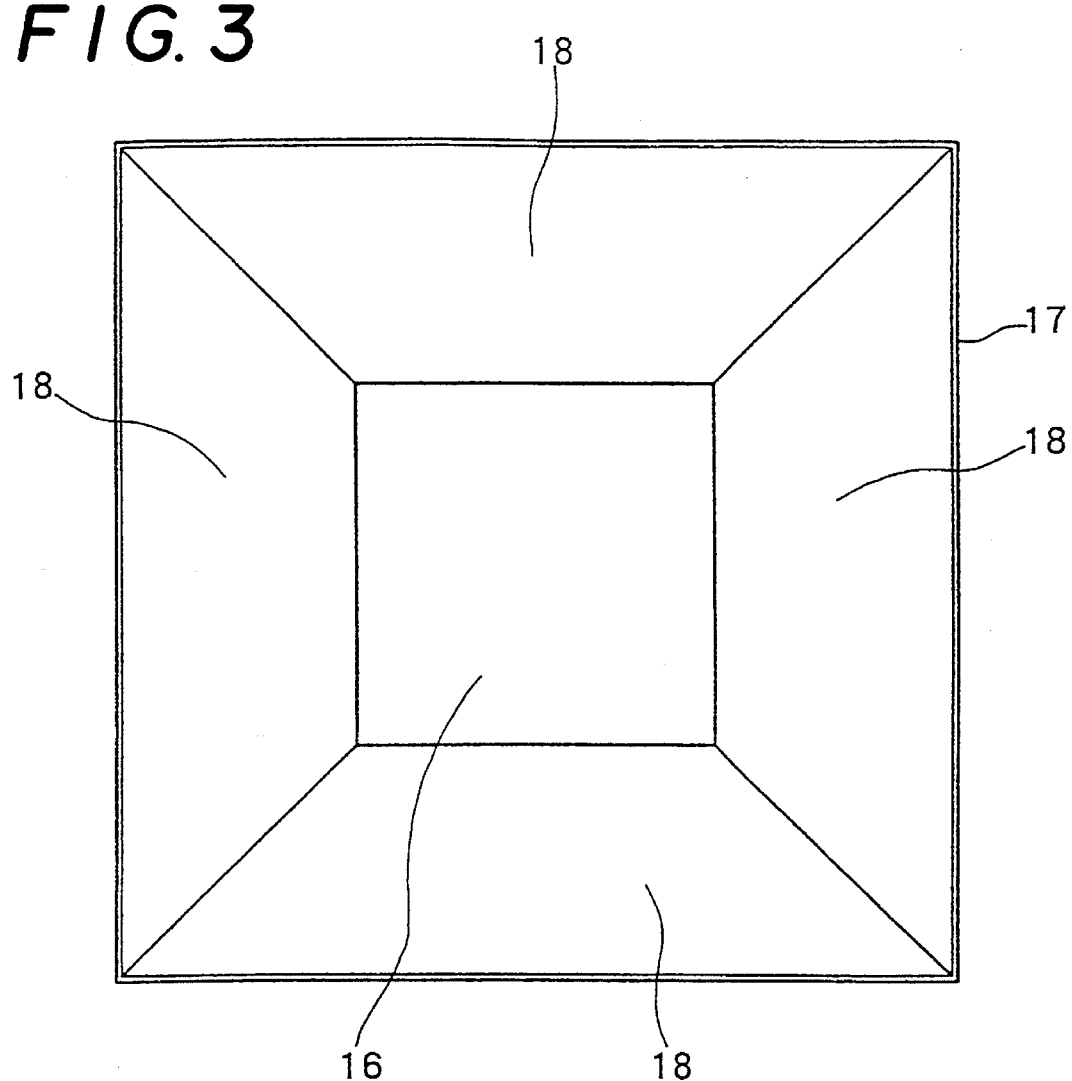
FIG. 3 is a plan view of a dust receiving pan used in the IC socket of FIG. 1.
Figure 4:
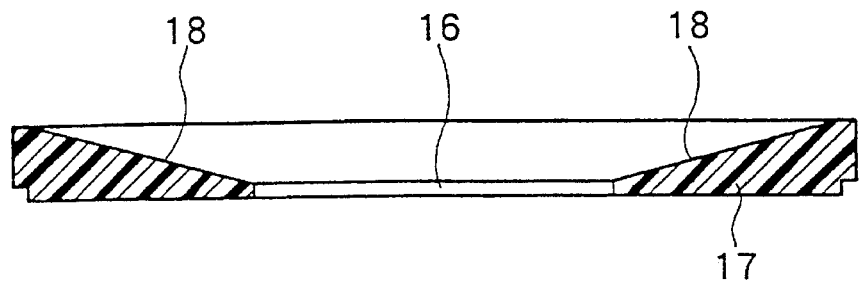
FIG. 4 is a cross-sectional view of the dust receiving pan of FIG. 3.

In FIGS. 1 and 2, the upper end is of the dust discharge duct 14 opens to the pedestal upper surface on each side of the pedestal 3 on which the IC leads 6 are arranged in side-by-side relation. A lower end of the dust discharge duct 14 opens into a central area, i.e., area immediately under the pedestal 3, of a lower surface of the IC socket and is in communication with each upper end (opening) 15 of the discharge duct 14. Owing to this arrangement, the dust which drops through each upper opening 15 is converged so as to be discharged from a lower opening 16. As shown in FIGS. 1 and 2, the lower opening 16 is formed by a dust receiving pan 17. This dust receiving pan 17 has the lower opening 16 at a central portion thereof. The dust receiving pan 17 also has an inclined surface 18 which inclines downwardly toward the lower opening 16. Owing to this arrangement, the dust 12, 13 dropped through each upper opening 15 is guided by the inclined surface 18 toward the lower opening 16 so as to be discharged through the lower opening 16.

The dust 12, 13 accumulated on the inclined surface 18 of the dust receiving pan 17 can also be removed by a vacuum force acting through the lower opening 16.

The dust receiving pan 17 may be formed, for example, as a separate member with respect to the socket body 1 and then assembled to the socket body 1, as shown in FIGS. 1 to 4.

The lower end of the dust discharge duct 14 is, as mentioned, open to the lower surface of the socket body 1 or defined as a closed bottom.

In the embodiment shown in FIGS. 2 and 5, the lower end of the dust discharge duct 14 is open by means of the lower opening 16. In FIG. 6, the lower end of the dust discharge duct 14 is defined as a closed bottom, so that the dust will be accumulated within the socket body 1.

In case the dust discharge duct 14 has a closed bottom, dust can be removed under the effect of a vacuum force, or the like, acting through the upper opening 15.

In the embodiments of FIG. 5 and 6, dust discharge ducts 14 opening respectively to two opposing sides of the pedestal 3 are independently provided. In other words, the dust discharge ducts 14 are not in communication with a single lower opening 16 as in FIG. 2. The lower end of each dust discharge duct 14 is open in FIG. 5, whereas the lower end of each dust discharge duct 14 is closed in FIG. 6.

In the above embodiments, the upper opening 15 of the dust discharge duct 14 is disposed at a lower part of a portion where the IC leads 6 exist and at an inside area of the connecting portion between the connection nose 11 of the contact 7 and the IC lead 6.

Specifically, the dust discharge duct 14 and the contact 7 are isolated from each other through a partition wall 19 which constitutes a part of the pedestal 3. The lead 6 and the contact 7 are connected to each other on an upper surface of this partition wall 19. The upper surface of the partition wall can thus be referred to as an IC lead receiving (or supporting) surface.

As one preferred embodiment, as shown in FIG. 5, a projecting edge forming a dust stopper 20 is provided along an outer edge of the upper surface of the partition wall 19 which supports a distal end of the lead 6, so that dust on the upper surface of the partition wall 19 will be prevented from dropping toward the contact 7 side.

This arrangement of the present invention provides a dust discharge means for the case in which the contact 7 is connected, in a pressing condition, to the upper surface of the distal end portion of the gull-wing lead as mentioned. Though not illustrated, an arrangement is possible in which the contact 7 is connected, in a pressing condition, to a basal portion 6b of a gull-wing lead or an outer surface of a J-bend lead, and the upper opening 15 is disposed at a location immediately under the connecting portion.

As another preferred embodiment, as shown in FIG. 6, a ridge 21 for restricting a side surface of the IC package body 5 is formed on an inner edge portion of the upper opening 15 of the dust discharge duct 14, a connecting portion between the contact 7 and the lead 6 is disposed at an outer edge portion of the upper opening 15, and the upper opening 15 of the dust discharge duct 14 is disposed between the connecting portion and the ridge 21.

According to the present invention, metal powder produced when the contact is connected to the IC lead under pressure, molding refuse adhered to the IC lead or the IC package body during the resin molding process of the IC package body, or dust adhered to the IC lead or the IC package body can drop through the dust discharge duct, thereby effectively resolving the problem of a short circuit formed between the IC leads due to the dust.

Also, the problem can be removed as much as possible in of the IC lead climbing over and being deformed by dust accumulated on that part of the IC package body which supports the lead can be reduced.

It is to be understood that the form of the invention herewith shown and described is to be taken as the preferred embodiment of the same, and that various changes in the shape, size and arrangement of parts may be resorted to without departing from the spirit of the invention or the scope of the subjoined claims.

What is claimed is:

1. An IC socket comprising:

an IC socket body having an IC receiving portion for receiving an IC package, and a pedestal provided at a lower portion of said IC receiving portion, said IC receiving portion including an IC body receiving portion for receiving an IC body of the IC package, said pedestal having an IC lead supporting surface located outwardly from said IC body receiving portion for supporting IC leads of said IC package;

a plurality of contacts mounted to said IC socket body for respectively pressing against the IC leads to create electrical connections when said IC package is received in said IC receiving portion and said IC leads are supported on said IC lead supporting surface; and wherein a dust discharge opening is formed in said pedestal through said IC lead supporting surface thereof, said dust discharge opening having an edge portion which contacts the IC leads of the IC package when the IC body is received in said IC body receiving portion and the IC leads are supported on said IC lead supporting surface.

2. An IC socket as recited in claim 1, wherein said IC contacts are arranged in side by side relation on said socket body.

3. An IC socket as recited in claim 1, wherein said dust discharge opening opens downwardly into at least one dust discharge duct, and said dust discharge duct has a closed bottom end.

4. An IC socket as recited in claim 1, wherein said dust discharge opening opens downwardly into a dust discharge duct, and said dust discharge duct has an open bottom end.

5. An IC socket as recited in claim 1, wherein said dust discharge opening opens downwardly into a dust discharge duct, and said dust discharge duct includes an upper duct portion opening upwardly through said dust discharge opening and a lower duct portion opening downwardly through a bottom of said IC socket.

6. An IC socket as recited in claim 1, wherein said dust discharge opening opens downwardly into a dust discharge duct, and said dust discharge duct includes an upper duct portion opening upwardly through said dust discharge opening and a lower duct portion having an open bottom end; and said lower duct portion is at least partly defined by an inwardly and downwardly inclined surface.

7. An IC socket as recited in claim 1, wherein said dust discharge opening opens downwardly into a dust discharge duct, and said dust discharge duct includes an upper duct portion opening upwardly through said dust discharge opening and a lower duct portion having an open bottom end; and said lower duct portion includes a lower opening which is positioned inwardly from said upper duct portion and is in communication with said upper duct portion.

8. An IC socket as recited in claim 1, further comprising a dust receiving pan mounted to said IC socket body and below said pedestal; and wherein said dust discharge opening opens downwardly into a dust discharge duct, and said dust discharge duct includes an upper duct portion opening upwardly through said dust discharge opening and a lower duct portion, said lower duct portion comprises a lower opening which is formed in said dust receiving pan.

9. An IC socket for use with an IC package having an IC body and IC leads, said IC socket comprising:

an IC socket body having an IC receiving portion and a pedestal provided at a lower portion of said IC receiving portion, said pedestal having an outer edge and an IC lead receiving surface located inwardly from said outer edge;

a plurality of contacts respectively having mounting portions mounted to said socket body outwardly from said outer edge of said pedestal, and IC lead contacting portions respectively movably mounted to said IC socket body for movement relative to said socket body between IC lead contacting positions in which said IC lead contacting portions are located adjacent said IC lead receiving surface, and IC lead releasing positions in which said IC lead contacting portions are located outwardly from said IC lead contacting positions; and wherein a dust discharge duct is formed in said pedestal through said IC lead receiving surface thereof, said dust discharge duct being disposed inwardly from said outer edge of said pedestal.

10. An IC socket as recited in claim 9, wherein said IC receiving portion of said IC socket body includes an IC body receiving portion; and said dust discharge duct is disposed outwardly from said IC body receiving portion.

11. An IC socket as recited in claim 9, wherein said IC contacts are arranged in side by side relation on said socket body.

12. An IC socket as recited in claim 9, wherein said dust discharge duct has a closed bottom end.

13. An IC socket as recited in claim 9, wherein said dust discharge duct has an open bottom end.

14. An IC socket as recited in claim 9, wherein said dust discharge duct includes an upper duct portion opening upwardly through said IC lead receiving surface and a lower duct portion opening downwardly through a bottom of said IC socket.

15. An IC socket as recited in claim 9, wherein said dust discharge duct includes an upper duct portion opening upwardly through said IC lead receiving surface and a lower duct portion having an open bottom end; and said lower duct portion is at least partly defined by an inwardly and downwardly inclined surface.

16. An IC socket as recited in claim 9, wherein said dust discharge duct includes an upper duct portion opening upwardly through said IC lead receiving surface and a lower duct portion having an open bottom end; and said lower duct portion includes a lower opening which is positioned inwardly from said upper duct portion and is in communication with said upper duct portion.

17. An IC socket as recited in claim 9, further comprising a dust receiving pan mounted to said IC socket body and below said pedestal; and wherein said dust discharge duct includes an upper duct portion opening upwardly through said IC lead receiving surface and a lower duct portion, and said lower duct portion comprises a lower opening which is formed in said dust receiving pan.

18. An IC socket comprising:

an IC socket body having a plurality of contacts for pressing against and electrically connecting to a plurality of leads of an IC package when the IC package is mounted on said IC socket body; and wherein a dust receiving pan is mounted to said IC socket body and is formed as a separate member with respect to said IC socket body;

wherein said IC socket body includes a dust discharge duct adapted to allow dust, produced or generated from the leads or a body of the IC package, to drop therethrough, an upper end of said dust discharge duct being open to a location below where the leads are positioned when the IC package is mounted on said IC socket body wherein a lower end of said dust discharge duct comprises a lower opening which is open to a lower surface of said IC socket; and wherein said lower opening is formed in said dust receiving pan.

* * * * *